United States Patent [19]

Avakian et al.

[11] 4,077,036
[45] Feb. 28, 1978

[54] DATA ENTRY DEVICES

[75] Inventors: Emik A. Avakian, 17 Stoney Brook Drive, Glastonbury, Conn. 06033; David Laizerovich, West Hartford, Conn.

[73] Assignee: Emik A. Avakian, Glastonbury, Conn.

[21] Appl. No.: 718,982

[22] Filed: Aug. 30, 1976

[51] Int. Cl.² .................. G08C 1/00; H01H 9/00
[52] U.S. Cl. .................. 340/365 S; 200/1 R; 200/5 A; 200/317; 200/DIG. 29; 273/1 M
[58] Field of Search ............ 200/1 R, 5 R, 5 A, 52 R, 200/61.1, 61.11, 175, 177, 61.52, 277, 292, 310, 314, 317, DIG. 29, 61.45 M, 46; 340/365, 365 R, 365 S, 334, 339; 273/130 A, 130 AB, 131 A, 131 AD, 134 A, 134 AE, 135 A, 135 AD, 136 A, 136 B, 1 R, 1 M; 335/205, 206, 207

[56] References Cited

U.S. PATENT DOCUMENTS

| 2,998,973 | 9/1961 | Schaper | 273/1 M |
| 3,261,941 | 7/1966 | Schlesinger, Jr. | 335/205 |
| 3,437,770 | 4/1969 | Piernik | 200/DIG. 29 |
| 3,474,366 | 10/1969 | Barney | 335/206 |
| 3,767,869 | 10/1973 | Lucas et al. | 200/177 X |
| 3,811,025 | 5/1974 | Bach | 200/5 A X |

FOREIGN PATENT DOCUMENTS 1,431,841  2/1966  France ................ 335/205

OTHER PUBLICATIONS

G. G. Promis et al, IBM Tech. Disc. Bull.; "Control Panel", vol. 19, No. 2, July 1976, pp. 405–406.
T. F. Cummings; IBM Tech. Disc. Bull.; "Bull Switch", vol. 15; No. 7; Dec. 1972; pp. 2207, 2208.

Primary Examiner—James R. Scott

[57] ABSTRACT

Apparatus for generating coded signals commensurate with information to be entered into associated equipment includes a matrix of magnetically operated switches. The switches are disposed beneath a generally planar data entry area and transparent indicia bearing overlays are received on the data entry area; the overlays including target points aligned with individual switches and there typically being fewer target points than switches whereby the overlay has space for the indicia and a plurality of overlays are utilized to take full advantage of the capability of the matrix. The apparatus may also include light emitting devices associated with the switches to provide operator feedback or guidance.

26 Claims, 7 Drawing Figures

DATA ENTRY DEVICES

BACKGROUND OF THE INVENTION (1) Field of the Invention

The present invention relates to the transferral of information from man to machine. More specifically, this invention is directed to data entry devices which facilitate communication between a human operator and a machine for various purposes. Accordingly, the general objects of the present invention are to provide novel and improved methods and apparatus of such character.

(2) Description of the Prior Art

The most commonly known and widely utilized data entry device for transferring information from man to a machine is the keyboard. Thus, it is well known to record information electronically employing, as the data entry device, typewriter or adding machine keyboards. Conventional typewriter keyboards and adding machine keyboards are, for all practical purposes, limited in utility respectively to the generation of text and the manipulation of numbers. The recent advent of inexpensive data processing apparatus, and particularly the general availability of computation devices known as microprocessors, has greatly increased the need for data entry and recording for many functions in addition to text generation or numerical manipulation. It is also to be observed that at least some formal training or considerable experience is required in order for an individual to operate a typewriter or adding machine with any degree of proficiency. There are many individuals, particularly in the medical and other professions, who may have neither the time nor the temperment to acquire adequate skills to use previously available keyboards. Thus, for a great many people who do not have keyboard training, experience and/or proficiency, there is a substantial and long-standing need of a technique which will facilitate communication with data processing equipment.

Examples of environments wherein a data entry device of enhanced flexibility and ease of use, when compared to a typewriter or adding machine keyboard, is required are the operation of point of sale devices, inventory entry and retrieval, automated customer operated banking and self-ticketing machines, computerized voting machines, teaching machines, etc. All of the aforementioned activities require data input and recording from man to machine and, to be practical, also require the allocation to single input devices of functional data which, if inputed in the form of a typewritten text, would necessitate a few to a substantial number of characters. Efforts to enhance the flexibility and thus utility of keyboard type data entry devices have largely been concentrated on the fabrication of large keyboards which have sufficient space adjacent each key or on the key top to identify the functions assigned to the keys. Such large keyboards have characteristically had the disadvantages of requiring a large area for designating the functions of the keys and difficulty in modifying the function labels. Furthermore, good human factors design requires that different groupings of functions be separated into clusters and it is difficult to modify groupings of keys on conventional or large scale keyboards in response to changes in requirements or differences in the functions to be performed at a given device or at the same device at different times or by different operators. Similarly, it would be difficult, if not impossible, to provide additional space for labeling of given areas by removing keys which are not needed for given applications.

As is implicit in the preceding remarks, there has been a long-standing desire in the art to provide a data entry device characterized by ease of operability, small or modest size, and "programmability" in the sense that the functions associated with each data input area and also the labeling associated with each such area are easily changeable. In addition, to be commercially successful, particularly in view of its prospect of being used by a plurality of different operators and also being subject to movement from place to place, the signal generating portions of the data entry device must be characterized by a high degree of reliability. The requisite reliability weighs against the use of complex circuitry and spring loaded input devices or other members which may be subject to degradation or failure as the result of continued flexing. Also, accuracy requirements dictate that the means for generating electrical signals in response to operator inputs be infallibly responsive to the operator's manipulative actions while being substantially immune to influences other than a deliberate act on the part of the operator.

A principal deficiency of previously available data entry devices resides in the fact that they do not have the capability of providing direct feedback to the operator indicative that an input signal generator, for example a certain switch with a given meaning, has been operated. There have been previous data entry devices which employed a pressure-sensing surface activated by a writing pen. In such devices reliance is made on the marks made by such pens to give limited feedback of questionable accuracy to the operator that certain points have been activated. To enhance the knowledge that the system has been activated, some prior data entry devices incorporate audio feedback. There is, however, no means of knowing with certainty that a given item has been entered.

A further data entry technique which is believed to warrant brief discussion is the light pen. For purposes of feedback to the operation of data entry, cathode ray tubes and light-emitting diode arrays have been used with so-called "light pens" which are sensitive to the light generated. Data is entered by pointing the light-sensing pen at the display and periodically scanning a light point faster than the eye can detect. The point at which the pen is directed is then permanently illuminated. A cathode ray tube display is, of course, large and bulky and the problem with the light pen, common to the means of lighting the display, is that it is sensitive to stray light. Accordingly, a mechanical switch is usually incorporated in the pen thereby adding to the maintenance problem.

For data entry functions it is also important for the operator to be able to review the information that has been entered for a given data entry sequence or transaction. At the present time this is possible only through the use of ancillary equipment employing devices such as the aforementioned cathode ray tube displays which are set apart from the data entry device; such ancillary equipment being of large size, expensive, relatively complex and requiring the operator to continually change his field of vision. Restated, present data entry devices do not incorporate positive means which enables operator review of a given data entry sequence or transaction consisting of a plurality of individual pieces of data. The provision of audio feedback, as discussed above, is clearly inadequate for such purposes; particularly in a noisy environment or when two data entry devices are within the hearing of both operators.

Continuing with a general discussion of the optimum characteristics of a data entry device, obviously such a device should minimize the human effort incident to the entry for recordation of data. Thus, by way of example and as discussed briefly above, the data entry device should have the capability of signifying an input, for example a lengthy name of a pharmaceutical, through a single action on the part of the operator thus saving not only the anguish of correctly spelling the name but also saving the time which would otherwise be required to enter a large number of characters. As noted above, previous keyboard type data entry devices could allocate such a single lengthy function identification to single keys only by resort to exceedingly large keyboards. It would also be highly desirable, in the interest of minimizing operator effort, to provide some form of "check off" list on the face of the data entry device which would either serve as a reminder to the operator of items which might be entered for a given application and/or guide the operator through a logical sequence of items to be checked off. In many cases it is desirable to program a logic processor associated with a data entry device so as to produce an indication that a given choice of category of item, if necessary, has not been selected. Thus, by way of example, if insurance data is being furnished to a logic processor by means of the data entry device and if the operator did not mark either "male" or "female" in the sequence of entries, the operator should be advised of his omission directly from the data entry device. Prior art data entry apparatus has lacked this "check off list" or "sequencing guidance" capability.

It is to be noted that data entry devices have on occasion been used to input graphic information where the information has been in the form of line segments. However, those entry devices which have received graphic information have been characterized by requiring an exceedingly dense configuration of activation points per square inch. This activation point density, in turn, has increased the expense while simultaneously reducing the reliability of the devices.

SUMMARY OF THE INVENTION

The present invention overcomes the above briefly discussed and other deficiencies and disadvantages of the prior art by providing a novel and improved data entry technique and apparatus for use in the implementation of such technique. The data entry technique and apparatus of the present invention includes a planar surface which defines a data entry area. This data entry area presents an uncluttered surface which receives a sheet-like overlay. A matrix of magnetically activated switches is disposed beneath the data entry area. The purpose of the overlay is to clearly designate the significance of the switches to be used for a given application. In the interest of maximizing the potential utility of the present data entry device, the switches will be laid out as densely as possible. Each overlay, while it could designate every switch in the matrix or at least every switch having meaning for the operator in a given application, will generally define entry areas which encompass less than all of the switches; i.e., there will generally be non-designated areas around clusters of switches. This arrangement allows a legend or other graphic material to be placed on the overlay directly over switches which will not have any significance for a given application thus further increasing the uncluttered appearance of the data entry area and significantly adding to the human-factor efficiency of entering the desired items.

In accordance with a preferred embodiment, the switches comprising the matrix are in part defined by a printed circuit element having a hole corresponding to each individual data entry area. A pair of electrically isolated arcuate contacts is provided at the periphery of each of these holes on a first side of the printed circuit element. One of the contacts associated with each hole in the printed circuit is connected to a trace or conductor extending along the second surface of the printed circuit in a first direction; there thus being a plurality of parallel "X" traces. The second arcuate contact at the periphery of each hole in the printed circuit element is connected to a trace or conductor on the first surface of the printed circuit element. The conductors or "Y" traces on the first surface of the printed circuit element will also be parallel to one another and will typically be oriented orthogonally to the traces on the second surface. In this manner rows of the holes will have a contact connected to an "X" trace while columns of the holes will have a second contact connected to a common Y trace; the X and Y traces and the contacts electrically connected thereto thus defining a matrix.

A ball of magnetic and electrically conductive material will be disposed in a blind hole positioned immediately beneath each hole in the printed circuit. Accordingly, in a preferred embodiment switch closures can be effected by bringing a magnet into alignment with the holes in the printed circuit thereby attracting the individual balls upward to the position where they bridge the arcuate contacts thus momentarily establishing an electrical circuit between an X trace and a Y trace.

In one embodiment of the invention, a protective layer of non-conductive material is provided over the printed circuit board and this protective layer may be provided with blind holes coresponding to each hole in the printed circuit. These blind holes, when utilized, served as guides for a magnetic pointer or pen employed to actuate the switches of the matrix.

As noted above, the present data entry devices hereinafter referred to as a "tablet", receives overlays, particularly transparent overlays, having indicia printed thereon. The overlays, which will be removable, will typically be provided with a hole pattern which is less dense than the hole pattern in the protective layer and/or printed circuit. Thus, the full capability of the tablet insofar as data entry is concerned may be achieved using a plurality of easily removable overlays with each overlay being characterized by there being sufficient space adjacent each hole to accommodate indicia which will identify the function assigned to the switch vertically aligned with the magnet guiding hole in the overlay. The overlay, by virtue of its thickness, may prevent activation of switches which have no meaning for a given application.

A tablet in accordance with the present invention may also be provided with a plurality of miniaturized light sources. These light sources, typically light emitting diodes, may be associated with each switch defining hole in the printed circuit or the light source may be arranged in any other desired pattern. The light emitting diodes or other light sources will, when associated with an individual switch, have a first lead attached to common traces and a second lead connected to one of the arcuate contacts of the switch with which the diode is associated. Logic circuitry permits the energization of the light sources either as a result of a given switch activation or prior to the switch activation to thus instruct the operator as to the next switch to be operated. Accordingly, a data entry device in accordance with the invention may have a visual indicator adjacent to activation points as required and, if not required to function as the primary feedback means, selected light sources may be omitted. The data entry devices of the present invention may also be provided with an alphanumeric display which can provide primary or secondary feedback to the operator.

BRIEF DESCRIPTION OF THE DRAWING

The present invention may be better understood and its numerous objects and advantages will become apparent to those skilled in the art by reference to the accompanying drawing wherein like reference numerals refer to like elements in the several figures and in which.

DESCRIPTION OF THE PREFERRED EMBODIMENT

Figure 1:
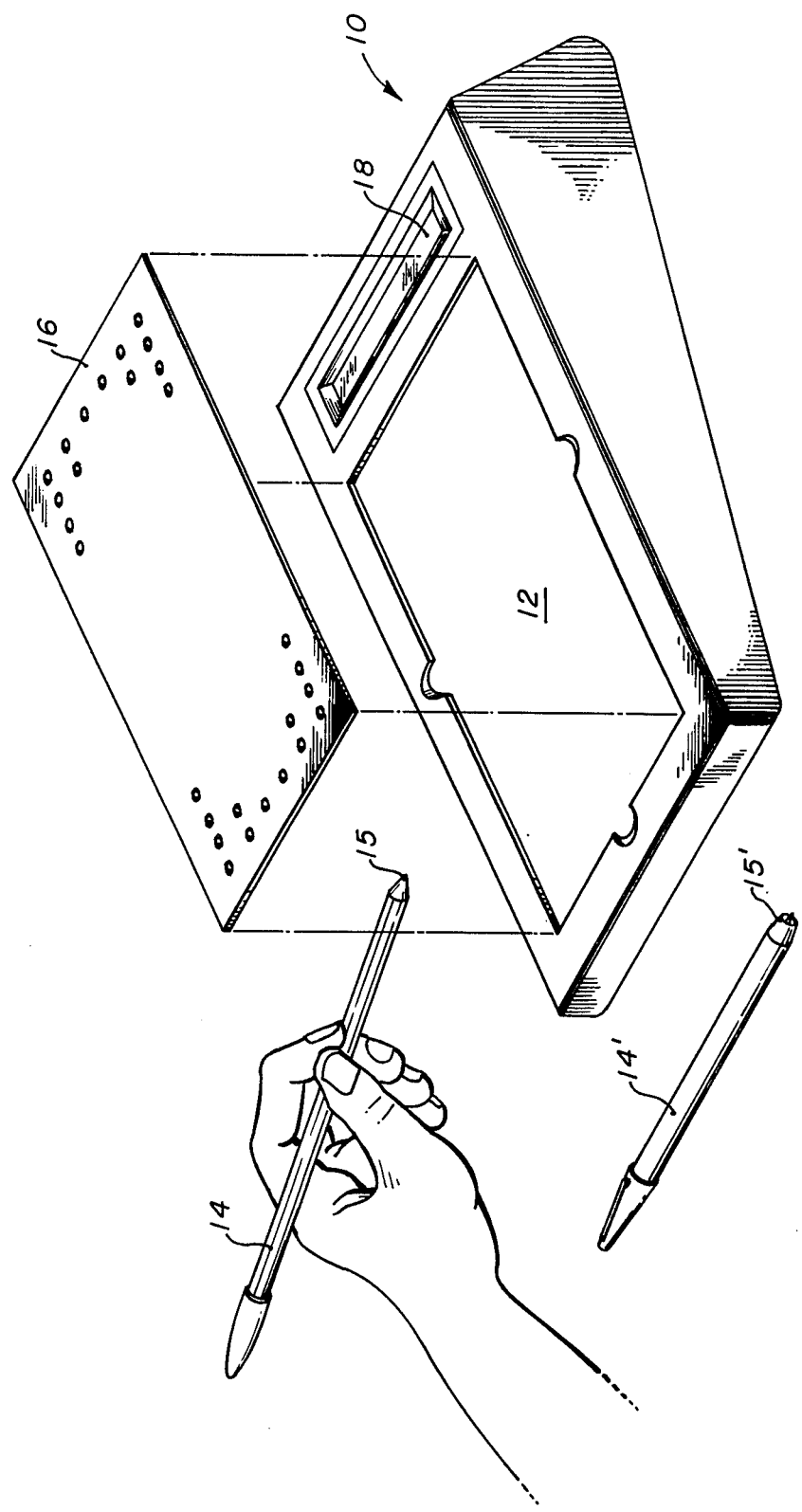
FIG. 1 is a perspective view of a data entry device in accordance with a first embodiment of the invention.
Figure 3:
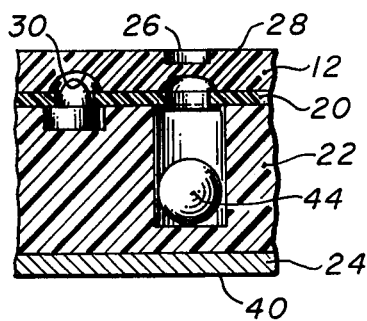
FIG. 3 is a partial cross-sectional side elevation view of a single switch of the matrix of the apparatus of FIG. 1.
Figure 2:
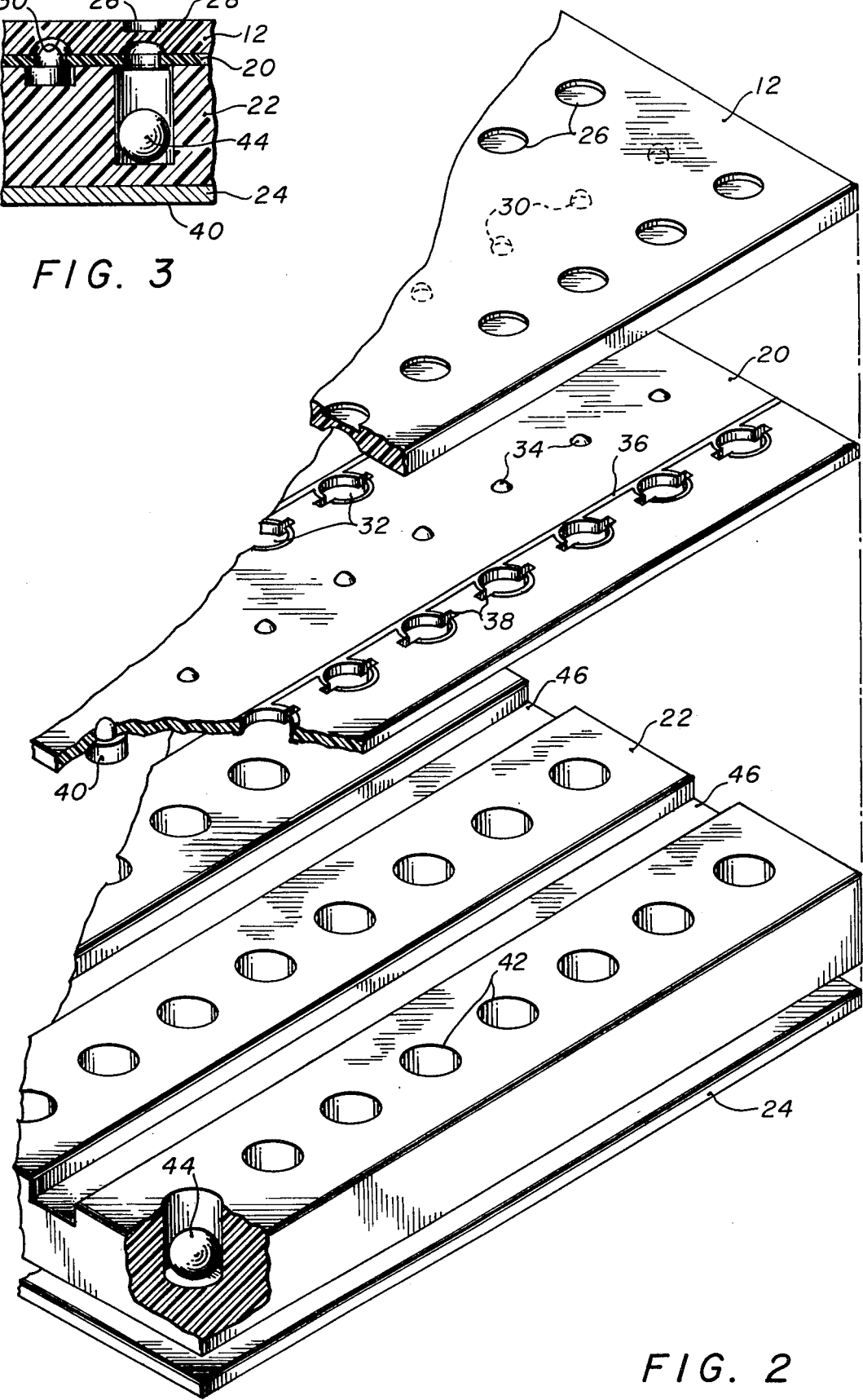
FIG. 2 is a partial exploded isometric view of the switch matrix defining elements of the apparatus of FIG. 1.
Figure 5:
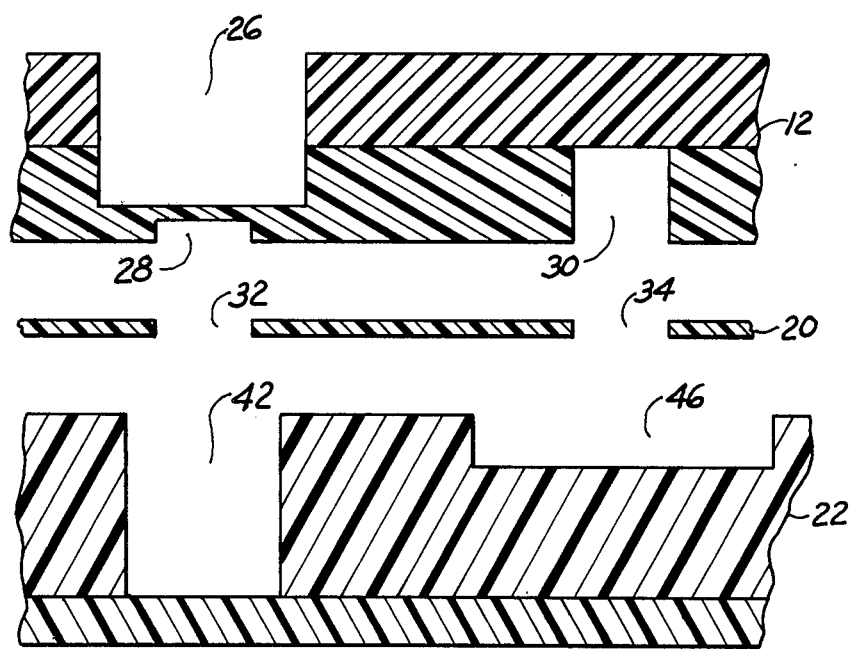
FIG. 5 is an exploded cross-sectional side elevation view which depicts the construction of the switch matrix of a data entry device in accordance with a preferred embodiment of the present invention.

With reference now to the drawing, a "tablet" in accordance with a first embodiment of the invention is depicted in FIG. 1 generally at 10. Tablet 10 includes, as will be described below, a switch matrix disposed immediately below a protective or "cosmetic" layer 12. The outwardly disposed surface of protective layer 12 may be either smooth, as shown in FIG. 1, or provided with a plurality of guide holes for receiving and directing a "magnetic pen" as shown in FIGS. 2, 3 and 5. Two different types of "magnetic pen" which may be used with the invention are indicated in FIG. 1 at 14 and 14'; the pens 14 and 14' respectively including points 15 and 15' formed from a magnetized material. A "pen" configuration has been chosen since most individuals are accustomed to manipulating such implements. The "point" 15' of pen 14' is actually a conical magnetic skirt. A writing tip, for example a ball point pen, may protrude from the skirt 15' as shown. This arrangement permits the pen tip to function as a guide, should the tablet and/or overlay be provided with guide holes therefore, and also permits the pen to be used for marking and writing. Thus, the pen 14' performs the dual functions of preparing a permanent record by the mark it makes whenever it is placed above a magnet switch while similtaneously serving to activate the switch. As will be obvious to those skilled in the art, when a written record is required the overlays, such as overlays 16 of FIG. 1, will be imprinted with a target which is used to aim the pen at the switch and neither the overlay nor the protective layer 12 need be perforated to provide pen guide holes. This arrangement, of course, requires that the operator aim his pen more carefully since he cannot rely upon engagement with a hole before there will be a switch activation. The magnet tip or skirt may, for example, be comprised of any material which generates a sufficiently strong field such as, for example, INCOR 16 available from Indiana General Corporation.

The upper face of tablet 10 is recessed as shown whereby the tablet will receive the overlays 16. The overlays may be fabricated from many materials including transparent sheets of plastic which have images transferred thereto by well-known reproduction techniques. If it is not required for the data entry application to change, the overlay can be fabricated from a comparatively thick sheet of plastic since the cost of each overlay would not be significant and, consequently, more cost can be put into its preparation. Such a relatively thick overlay could have holes above those switches which are to be used for a given application and the overlay might be actually laminated to and thus form a part of the protective layer 12. The overlay, and particularly a relatively thick permanent or semi-permanent overlay, will be provided with recesses; i.e., regions of reduced material thickness; above those switches in the underlying matrix which are to be used for the given application. The presence of these regions of reduced thickness makes possible a more deliberate selection of the switch to be activated since switch closure will be possible only when a magnetic pen 14 is engaged with a recess in the overlay.

Other types of overlays can be made of thin sheets of paper or plastic with or without holes punched into the sheet above the switches to be used for a given application. The protective layer 12, presuming a perforated removable thin plastic or paper overlay, will customarily have a blind hole above each switch and the guiding of the magnetic pen into the proper location for activating a switch will be assisted by the thus aligned holes in the overlay and protective layer.

To summarize, the overlays 16 will be provided with a target or hole pattern which will be less dense, by a wide range of factors depending on the given application, than the density of the magnetic switches comprising the matrix. The spacing of the targets on or the holes in overlay 16 is thus chosen so as to enable the overlay to bear indicia commensurate with the data to be entered in a computer or other apparatus via tablet 10. The tablet may be provided with conventional means, not shown, for insuring installation of overlay 16 with its holes or targets in registration with switches. A particular advantage of the present invention resides in the fact that when a switch is not used there will be no aligned target on or hole in the overlay and thus additional space will be available on the overlay for indicia commensurate with the functions of the switches utilized for the particular application.

Tablet 10 may also be provided with an alphanumeric display 18. The display 18, if provided, will typically be of the type which provides two lines with 32 characters in each line.

To briefly summarize the external physical characteristics of tablet 10, the device is small enough to be held in the lap of the user and receives, in a recessed area surrounded by a rectangular frame, overlays which bear indicia. The overlays will be formed of a non-metallic material and typically, but not necessarily, will be provided with magnetic pen guiding holes. Proper registration of the overlay on the tablet may be accomplished solely through use of the rectangular frame or other locating means may be employed. Additionally, the tablet may be provided with means which "reads" indicia on the overlay whereby a computer associated with the tablet may be programmed commensurate with the particular overlay which has been installed.

Referring now jointly to FIGS. 2 and 3, the components which define the switch matrix within tablet 10 are shown. These components include, proceeding from the protective or cosmetic layer 12 inwardly, a printed circuit element 20, a socket defining base member 22 and a biasing plate 24. As discussed above, protective or cosmetic layer 12, which has been shown in FIGS. 2 and 3 as formed from a single sheet of material in the interest of facilitating understanding of the invention, may be either smooth surfaced or provided with a plurality of blind magnetic pen guide holes as indicated at 26. As may best be seen from a joint consideration of FIGS. 2 and 3, the bottom of layer 12 may be provided with blind holes 28 which are in alignment with holes 26. For purposes which will be described below, a further array of blind holes 30 may be formed in the underside of layer 12. The protective or cosmetic layer 12 will typically be comprised of a polycarbonate having a scratch-resistant top surface or some other similar plastic. Layer 12 will also typically be of a dark color, but will be translucent to the light emitted by diodes 40.

In the disclosed embodiment the printed circuit element 20 will be in the form of a rigid printed circuit board. However, the use of a flexible printed circuit is within the scope of the present invention. It is also to be noted that the conductive regions on printed circuit board 20, with the exception of the switch contacts in FIG. 3, have been omitted from FIGS. 3 and 5 in the interest of facilitating understanding of the invention. Printed circuit board 20 is provided with a plurality of through holes 32 which are arranged so as to define rows and columns. Two rows of holes 32 are depicted in FIG. 2. Printed circuit board 20 may be provided with additional through holes 34 which are also arranged in columns and rows; there typically being one of such additionally through holes 34 for each of holes 32. The conductor pattern on printed circuit board 20, which will be discussed in greater detail below, includes "X traces" 36 on the upper surface, "Y traces" 46 on the lower surface, and a plurality of further parallel conductive paths 48 on the lower surface. The choice of a flexible printed circuit for board 20 may be dictated by the fact that current technology permits the production of extremely thin printed circuits in flexible form; i.e., a flexible printed circuit would not be employed to take advantage of its bending properties. Printed circuit board 20 should be as thin as possible so as to reduce the distance over which the magnetic forces from the pen are required to act to lift switch element balls 44 (FIGS. 2 and 3) and also to present the lens of the light sources; i.e., light emitting diodes 40 (FIGS. 2 and 3) as close to the upper surface of layer 12 as is possible.

After the conductive material has been deposited or etched on board 20 to define the conductive paths, the holes 32 are plated through between the top and bottom of the board. Thereafter, in accordance with one production technique, rectangular cuts 38 are made either mechanically, by chemical etching or optically employing a laser beam to define a pair of electrically isolated contacts which in part describe arcs of less than 180° about the lower periphery of each of holes 32. The cuts 38 can best be seen from FIG. 2. In the disclosed embodiment the cuts 38 are aligned with the X traces 36 and all of the contacts on the first side of all of the holes in a row will be electrically interconnected by means of an X trace 36 as also shown in FIG. 2. The printed circuit will be described in greater detail below in the discussion of FIG. 4.

Figure 4:
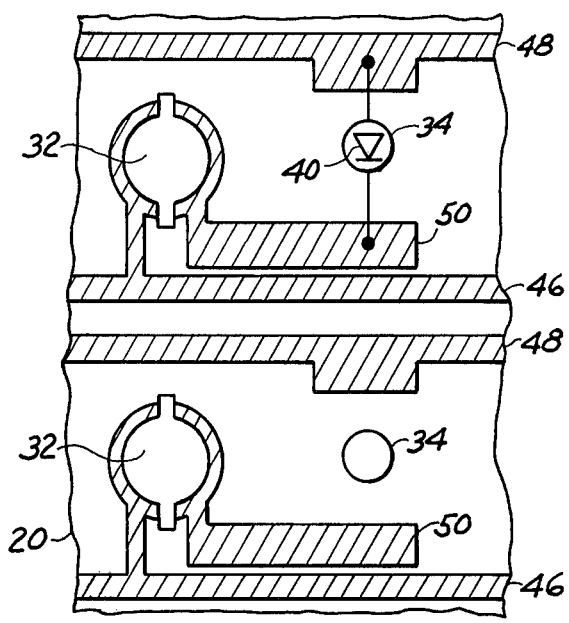
FIG. 4 is a partial bottom view of the printed circuit element of the embodiment of FIG. 2.

In the embodiment depicted in FIGS. 2-4, each of the holes 34 in printed circuit board 20 receives the lens of a light emitting diode 40. The diodes 40, when provided, are interconnected into the circuit defined by conductors on board 20 in the manner indicated schematically on FIG. 4. The lenses of the diodes project above circuit board 20 and, as may be seen from FIG. 3, extend into the holes 30 in the underside of protective layer 12. The holes will typically be finished in a domed shaped whereby the layer 12 defuses the light emitted from the diodes 40 so that it can be viewed from a large angle from the perpendicular to the surface of layer 12. This arrangement eliminates the necessity of providing holes in the overlays 16 to make the light sources visible therethrough. The holes 28 and/or 30 in the underside of protective layer 12 may, rather than being individual blind holes, be in the form of milled channels in the interest of minimizing manufacturing costs.

In the final assembly the light emitting diodes will typically be positioned directly above each switch in the data entry plane whereby the light sources may act as a feedback to the operator to advise him that the switch directly below his pen has been activated during a given data entry procedure. The light emitting diodes 40 may also, under suitable computer program control, function as a guide or sequencing means to inform the operator as to which switches should be selected next. If a particular light source has significance for a particular application, the overlay 16 must be transparent directly above the light source or be provided with a through hole aligned therewith. Those light sources not needed for a given application need not be so exposed.

The base member 22 will be formed of a suitable non-conductive material, for example LEXAN or some equivalent material, and will be provided with an array of blind holes 42 which are coaxial with the holes 32 in printed circuit board 20. Holes 42 in member 22 are of greater diameter than holes 32 in the printed circuit board and receive balls 44. Balls 44 will typically be comprised of steel so that they may be attracted by the magnetic pens or pointers 14. Balls 44 must, of course, be comprised of a conductive material so that, when caused to move upwardly against the base of the printed circuit board 20, which traps the balls in holes 42, the balls will bridge the pair of arcuate contacts at the base of each of the holes in the printed circuit board. As will be obvious, the balls 44 could be magnets and the tips of the pens comprised of a magnetic material. The base member 22 is also provided, in the disclosed embodiment, with channels 46 which receive the body portions of the light emitting diodes 40.

Since a tablet in accordance with the present invention will often be used for hand-held operations, and thus will not always be sitting on a horizontal surface, a biasing plate 24 may be positioned at the bottom of the switch matrix assembly in the interest of maintaining the balls 44 at the bottom of holes 42 until such time as a switch closure is desired. Plate 24 will thus attract balls 44 to the bottom of holes 42, regardless of the angle at which the tablet 10 is held, until the attraction of balls 44 to plate 24 is overcome by the alignment of a pen with a hole 42 in the base layer 22. The biasing plate or layer 24 may be formed from a plastic material having powdered magnetic material embedded therein. Such a filled plastic material can be molded to shape and, subsequently, the sheet can be magnetized. A suitable plastic material with powdered magnetic material embedded therein is available from the Rilsan Corporation of Glen Rock, New Jersey. It is also noteworthy that the holes 42 in base member 22 may be through holes rather than blind holes with the biasing plate 42 covering the lower ends thereof to thus define blind holes.

Considering now FIG. 4, a portion of the bottom or Y trace side of printed circuit board 20 is shown. The conductive paths on the bottom of board 20 define the Y traces or column conductors and thus are preferably arranged perpendicular to the X trace conductors 36 on the top side of board 20. In FIG. 4 two of the Y trace conductors are indicated at 46. In addition, LED traces 48 are formed on the underside of board 20; the LED traces being generally parallel to the Y traces. FIG. 4 also clearly indicates a preferred configuration of the arcuate contacts at the base of each switch matrix defining hole 32 in board 20. The contact at the side of each hole 20 which is not connected to a Y trace 46; i.e., the contact pads which are extended to define terminal pads 50 to which first contacts of the light emitting diodes 40 may be connected. One of light emitting diodes 40 is shown schematically in FIG. 4 as positioned in one of the holes 34. To enhance the reliability of the tablet, the contacts at the base of each of holes 32 will typically be plated with nickle or some other conductive material which will not oxidize and which will withstand repeated impacts by balls 44.

Referring briefly to FIG. 5, in actual practice the protective or cosmetic layer 12 and the base member 22 will be multilayer structures as shown. The fabrication of these members as multilayer structure will be in the interest of facilitating the manufacture of the device and particularly in the interest of minimizing the need for drilling blind holes. The entire switch matrix subassembly, including the multilayer elements 12 and 22, may be bonded together to form a hermetic unit and such bonding can be performed in an inert gas atmosphere.

Figure 6:
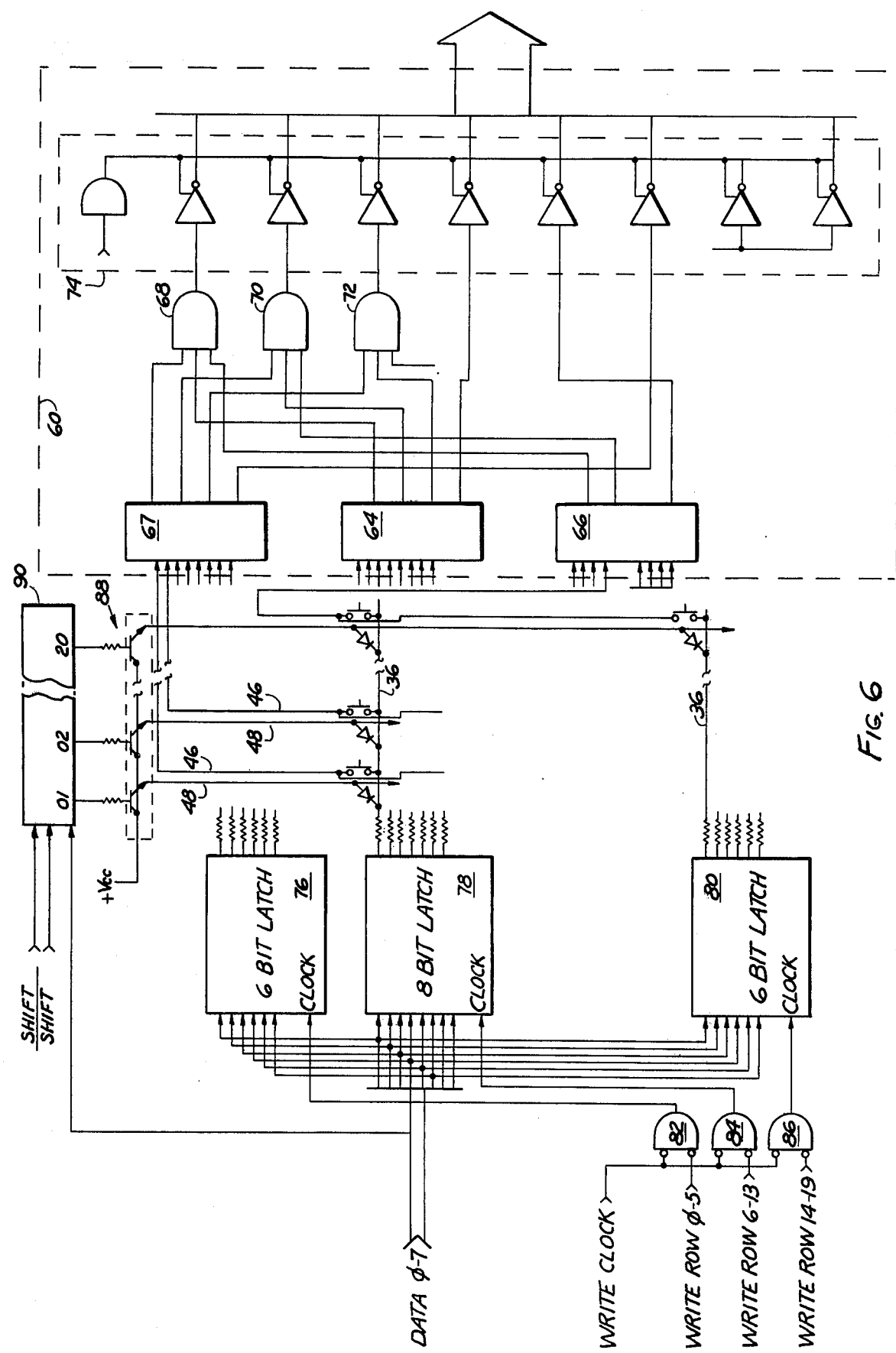
FIG. 6 is a functional block diagram of logic circuitry which may be employed in a data entry device in accordance with a preferred embodiment of the invention.

Referring now to FIG. 6, exemplary logic circuitry which may be incorporated within tablet 10 is shown in block diagram form. It is to be understood that a tablet including the circuitry of FIG. 6 will be coupled to a digital computer and the tablet will thus provide input information to the computer and will receive control signals from the computer. The means by which the computer stores information from the tablet and, in response to received information, generates control signals for the logic circuitry within the tablet are standard in the art, do not comprise part of the present invention and will not be described herein. The circuitry of FIG. 6 includes a column position decoder indicated generally at 60. Column position decoder 60 includes a plurality of commercially available Type 74148 priority encoders as indicated at 62, 64 and 66. Decoder 60 also includes AND gates 68, 70 and 72 and an eight bit three state buffer 74. Buffer 74 may be a commercially available Type 74-S240 while gates 68, 70 and 72 each comprise one-third of a standard Type 7411 gating circuit. The column position decoder 60, in the manner to be described below, provides digital output information commensurate with the column number of the column of the switch matrix having a magnetic switch which has been operated.

The logic circuitry within tablet 10, in accordance with the embodiment of FIG. 6, also includes input latches 76, 78 and 80 which operate under the control of the computer. The latches 76, 78 and 80 are connected to the computer data bus and, in addition to receiving input information from the data bus as provided by the computer during a data input portion of the operational cycle, also receive clock input signals as respectively provided by AND gates 82, 84 and 86. The gates 82, 84 and 86 each receive clock pulses from the computer and respectively receive row group "write" commands from the computer.

Presuming a tablet which defines a twenty by twenty switch matrix, the encoders 62, 64 and 66 have inputs connected respectively to each of the twenty Y traces on the printed circuit board 20. The outputs of latches 76, 78 and 80 are respectively connected, via equalizing resistors, to the twenty X traces 36 on circuit board 20. The magnetic switches, as depicted schematically in FIG. 6, are each interposed between an X or row trace and a Y or column trace. The light emitting diodes 40 are arranged so as to be connected between the X traces 36 and the light emitting diode column traces 48 as may also be seen from FIG. 6. Each of the LED traces 48 is connected to the emitter of a transistor which functions as a column driver for the light emitting diodes. The column drivers for the diodes are indicated generally at 88. The bases of the individual column driver transistors are respectively coupled to the output terminals of the stages of a twenty bit shift register 90. In actual practice shift register 90 will comprise two serially connected ten bit shift registers which may, for example, be Signetics Type 8273 registers. The last stage of the first shift register in this series connection will be connected to the data input to the second shift register. Shift register 90 is connected to the computer data bus from which it receives the initial active bit input to begin a driver scan phase. Shift control inputs to register 90 are also provided from the computer as shown to input the initial bit and to subsequently activate each successive driver.

To briefly describe the operation of the circuitry of FIG. 6, under control of the computer the row outputs of latches 76, 78 and 80 will initially all be at the zero level while the column inputs to the priority encoders 62, 64 and 66 will be at a high level commensurate with the power supply voltage $V_{CC}$. Upon the operation of one of the magnetically operated switches of the matrix a column input to the priority encoders will be connected to one of the latches row outputs resulting in that particular column input to a priority encoder being "pulled down" thus providing an input to the column position decoder 60. This input will be encoded and delivered, via the gates 68–72 and buffer 74, to the computer thus giving the computer information commensurate with the column in which the closed switch is located. This column position information will be stored in the computer and will initiate a row scanning operation which is performed under the control of the computer in accordance with its stored program. The row scanning operation will include the initial step of switching the outputs of latches 76, 78 and 80 to the high or "one" level. Thereafter, under the control of the clock signals provided by gates 82, 84 and 86 and the information on the data bus, the outputs of latches 76, 78 and 80 will "rippled"; i.e., the latch outputs will serially and individually be switched back to the zero state. When that row connected to the switch which has been closed is switched to the zero state the column position decoder will again provide an output signal which should be identical to the previously generated output signal; a comparison being made if deemed necessary for accuracy purposes. A counter in the computer will indicate the number of times the singular zero state has been advanced at the output of the latches until the column position decoder provides its second output. This number will be the row designation. The number stored in the computer internal counter, commensurate with the row position of the closed switch, will be encoded and added to the column position information previously stored to thus provide complete identification of the switch which has been operated. The entire scanning operation will be under the control of the computer internal clock and will occur during the momentary closure of any one of the magnetically actuated switches.

During a display phase, which alternates with the input phase briefly described above, the transistors comprising column driver 88 are individually turned on by the outputs of shift register 90. When the appropriate column driver is biased to the conductive condition, assuming that the display pattern for this column is presented at the latch outputs by the computer in response to a previous activation of the corresponding switch, a bias voltage will be applied across the light emitting diode 40. This diode energizing bias will be maintained until the computer commands that the display be advanced by turning off the conductive column driver and turning on the next succeeding driver. A scanning of the LED's during a display phase will be at a sufficiently fast rate such that, due to the retention properties of the human eye, the light sources will appear to remain on. Thus, the operator may, as desired, be provided with a visual feedback indicating the successful operation of a particular input switch and these light sources may be caused to appear in the energized state until the entire transaction has been completed.

Figure 7:
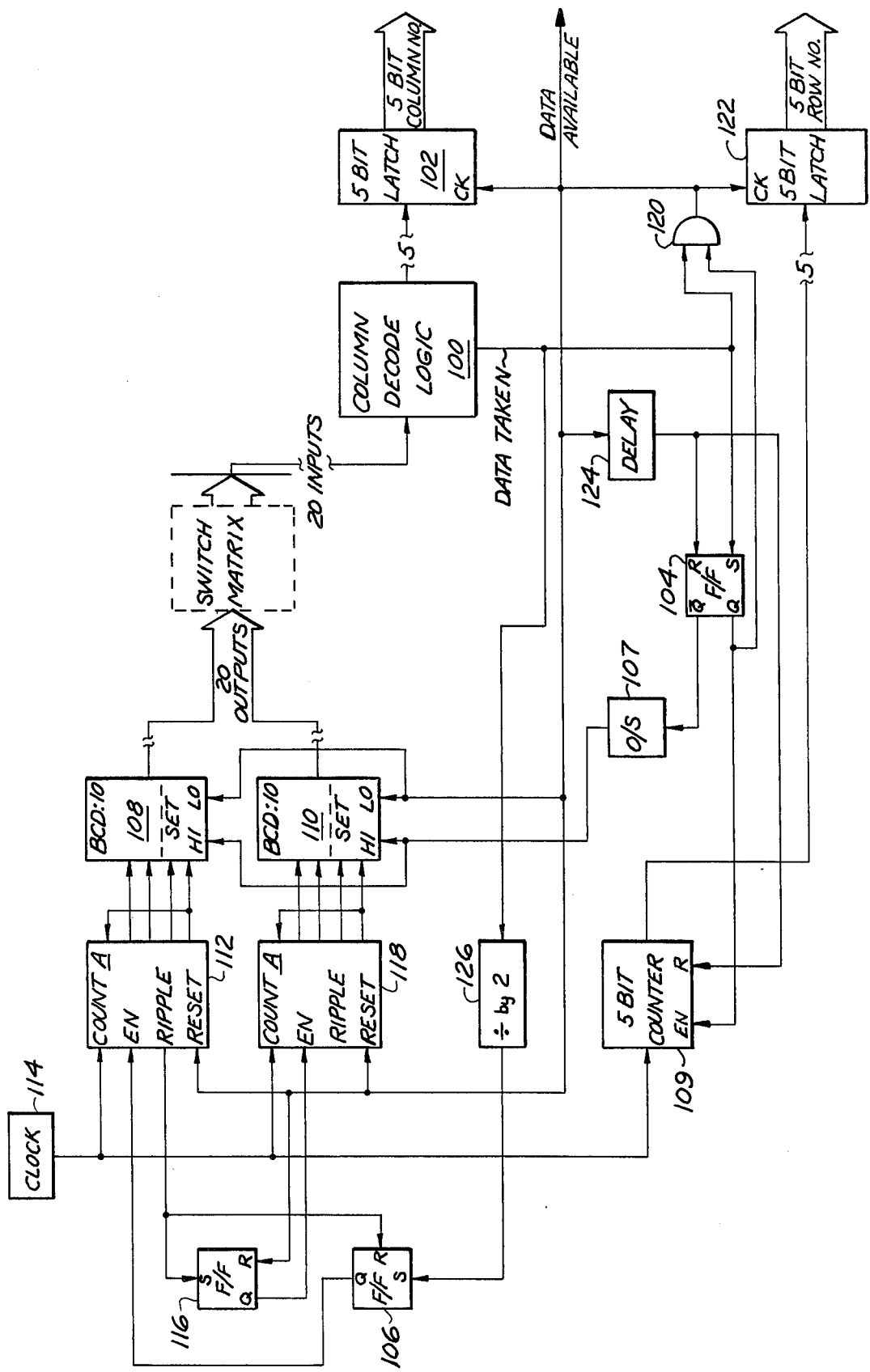
FIG. 7 is a functional block diagram of alternative logic circuitry which may be incorporated in a data entry device in accordance with the present invention.

FIG. 7 represents logic circuitry which may be employed in tablet 10 when it is desired to have the tablet provide, without reliance on a computer for control inputs, output information commensurate with the most recently operated switch of the magnetic switch matrix. The circuitry of FIG. 7 is a keyboard encoder and commercially available keyboard encoders could, with minor modification, be employed in the tablet 10. Circuitry for energizing the light emitting diodes or other light sources has been omitted from FIG. 7 in the interest of facilitating understanding of the operation of the logic.

In the manner known in the art, either the application of power to the tablet or a generation of a signal indicative that data is available at the outputs of terminal 10 will cause the initial setting of the logic circuitry in the manner to be described below. As in the case of the circuitry of FIG. 6, again presuming a twenty by twenty switch matrix, the column outputs of the switch matrix are connected to individual inputs of a column position decoder 100. As described above, the inputs to decoder 100 will initially be "high". The row inputs to the switch matrix will each be connected to an output of one of a pair of BCD:10 decoders 108 and 110. The decoders 108 and 110 are initially set "low" by either the application of power or the generation of a "data available" signal and apply "low" or "0" signals to the row inputs to the magnetic switch matrix. Accordingly, in the manner described above with respect to FIG. 6, the closing of any switch in the matrix will result in an input to the column position decoder 100 being "pulled down". The column position decoder 100 will generate a signal commensurate with the column number of the decoder input which has been "pulled down" and this signal will appear at the input to a five bit latch 102. Simultaneously, the column decoder 100 will provide a "data taken" output.

The "data taken" output from column position decoder 100 is employed to set a pair of flip-flops 104 and 106; the data taken signal being delivered to flip-flop 106 via a divide-by-two circuit 126. The setting of flip-flop 104 will trigger a one shot multivibrator 107 and will cause the enabling of a five bit counter 109 and an AND gate 120. The output pulse from one shot multivibrator 107 will switch decoders 108 and 110; i.e., these two BCD:10 encoders will be set "high" by the output of multivibrator 107 whereby "1's" will be applied to the row inputs to the switch matrix. The output of one shot multivibrator 107 will also cause the resetting of a pair of series connected decade counters 112 and 118. The counters 112 and 118 each provide output information, on four lines, to respective BCD:10 decoders 108 and 110. Decoders 108 and 110 will "switch" individual outputs commensurate with the input information received from their respective decade counters.

The setting of flip-flop 106 in response to the generation of a "data taken" signal will result in an enabling signal being applied to counter 112. Counter 112 will thus begin counting under the control of oscillator 114. The final stage or "ripple" output of counter 112 is employed to set a further flip-flop 116 which, in turn, generates a signal which enables counter 118. The output of oscillator 114 is also directly delivered to the inputs of counter 118 and the five bit counter 109. As counters 112 and 118 are serially counted, the row outputs of decoders 108 and 110 will be "rippled"; i.e., the row inputs to the switch matrix will be serially switched from the "1" to the "0" state. When the row input commensurate with the closed switch in the matrix is switched to the "0" state, the column input to column position decoder 100 will again be "pulled down" whereby a second "data taken" signal will be generated by the column position decoder 100. This second "data taken" signal will be delivered, via AND gate 120, to the clock inputs to latch 102 and a further five bit latch 122. The latches 102 and 122 will thus accept and store the output information respectively from decoder 100 and counter 109. The enabling of latches 102 and 122 will, accordingly, result in the switch column position and row position information respectively being presented, in static form, at outputs of the tablet. As noted above, the generation of the "data available" signal, as provided at the output of AND gate 120, will cause the BCD:10 decoders to again be set "low". Also, after a delay sufficient to insure the clocking of the column and position information into latches 102 and 122, is imparted to the signal by delay circuit 124, the "data available" signals will be employed to reset the scan phase control flip-flop 104 and counter 109. The "data taken" signal from decoder 100 is, as explained above, delivered to flip-flop 106 via the divideby-two circuit 126 whereby flip-flop 106, which may have been reset by the "ripple" output of counter 112, will not re-enable counter 112 until data is both available and has been taken; i.e., flip-flop 106 will be set by alternate "data taken" signals.

While the disclosed embodiment of the present invention is a printed circuit implementation, it is to be noted that the contacts of the switches of the magnetic switch matrix may be defined by discrete wires which are laid down on a surface of the board. There are commercially available techniques for laying down parallel wires on the surface of a printed circuit board. In the case of the instant invention parallel wires could be positioned on the bottom of board 20 and so as to extend across arcs of the circles defined by the through holes in the board. The balls 44, when raised, would contact and thus short circuit the spaced wires thus causing a switch closure. The holes in the printed circuit board would, of course, be necessary so as to enable the ball to move upwardly a sufficient distance to insure contact with both wires. As in the case of the printed circuit implementation described above, the multi-wire embodiment would employ a coating, for example a nickel coating, on the wires at least in the contact areas to insure against oxidation thereof.

It is also to be noted that the "magnetic pens" of the present invention can, rather than being in the form of pointers which are manually movable about the data entry area, be in the form of keys associated with either a permanent or semipermanent overlay; striking the keys causing the momentary depression of spring loaded plungers which include magnets or, if the balls 44 are magnetized, comprise steel rods.

While a preferred embodiment of the present invention has been shown and described, various modifications and substitutions may be made thereto without departing from the spirit and scope of the invention. Accordingly, it is to be understood that the present invention has been described by way of illustration and not limitation.

What is claimed is:

1. Manually operable apparatus for generating signals commensurate with information to be transmitted to other equipment, said signal generating apparatus comprising:
    switch matrix means, said switch matrix means including:
        a circuit defining element, said circuit defining element being provided with a pattern of apertures and supporting a plurality of conductors, said conductors being arranged so as to at least in part intercept at least some of said apertures in pairs whereby each of said intercepted apertures may be identified by a unique pair of conductors;
        base means, said base means defining a plurality of receptacles having a generally circular cross-section, said base means being juxtapositioned to a first side of said circuit defining element with said receptacles arranged coaxially with said apertures and facing said circuit defining element; and
        a spherical conductive member disposed in each of said base means receptacles, said conductive members having a diameter less than the diameter of said receptacles whereby said conductive members are freely movable in said receptacles;
    protective cover means, said cover means having a first surface juxtapositioned to and generally coplanar with the second side of said circuit defining element, said cover means having a second surface which defines a data input area, said cover means second surface forming at least part of an exposed face of said housing; and
    means for actuating the switches of said matrix means, said conductive members being caused to move by magnetic attraction into contact with a pair of intercepting conductors to bridge said conductors when said actuating means is aligned with the circuit defining element aperture with which said conductors are associated.

2. The apparatus of claim 1 wherein said protective cover means is further characterized by regions of reduced thickness in registration with said circuit defining element apertures.

3. The apparatus of claim 2 wherein said protective cover means regions of reduced thickness are in part formed by recesses in the second surface thereof.

4. The apparatus of claim 3 wherein said cover means includes:
    a perforated indicia bearing overlay; and
    a planar protective member disposed between said overlay and said circuit defining element.

5. The apparatus of claim 4 wherein said overlay is removable from said protective member.

6. The apparatus of claim 4 wherein said protective member is provided with coaxial blind holes extending from both sides thereof, said blind holes being aligned with perforations in said overlay.

7. The apparatus of claim 6 wherein said overlay is removable from said protective member.

8. The apparatus of claim 1 further comprising:
    means for magnetically biasing said conductive members away from said circuit defining element, said biasing means being positioned on the side of said base means disposed away from said circuit defining means.

9. The apparatus of claim 1 further comprising:
    a plurality of light sources, said light sources being individually associated with at least some of said circuit defining element apertures, said light sources being positioned so as to be visible through said cover means when energized.

10. The apparatus of claim 9 wherein said light sources are light emitting devices having at least two terminals, a first terminal of each of said light emitting devices being connected to a first intercepting conductor associated with an aperture, and wherein said circuit defining element further includes:
    further conductors supported on said circuit defining element for establishing a common connection between second terminals of groups of said light emitting devices.

11. The apparatus of claim 1 wherein said base means receptacles have a diameter which exceeds the diameter of said circuit defining element apertures and said conductive members are captured in said receptacles by said circuit defining element.

12. The apparatus of claim 5 wherein said base means receptacles have a diameter which exceeds the diameter of said circuit defining element apertures and said conductive members are captured in said receptacles by said circuit defining element.

13. The apparatus of claim 12 further comprising:
    means for magnetically biasing said conductive members away from said circuit defining element, said biasing means being positioned on the side of said base means disposed away from said circuit defining means.

14. The apparatus of claim 13 further comprising:
a plurality of light sources, said light sources being individually associated with at least some of said circuit defining element apertures, said light sources being positioned so as to be visible through said cover means when energized.

15. The apparatus of claim 14 wherein said light sources are light emitting devices having at least two terminals, a first terminal of each of said light emitting devices being connected to a first intercepting conductor associated with an aperture, and wherein said circuit defining element further includes:
further conductors supported on said circuit defining element for establishing a common connection between second terminals of groups of said light emitting devices.

16. The apparatus of claim 1 wherein said circuit defining element comprises:
printed circuit means, said circuit means having a first array of through holes of a first diameter arranged in columns and rows, said circuit means further including pairs of contact areas on a first surface about the periphery of at least some of said holes, said contact areas being at least partly arcuate in shape, a first of each of said contact areas for each hole in each row being interconnected by a common conductor disposed on a first surface of said printed circuit means, the second contact areas of each pair being interconnected in columns by means of conductors passing through and principally disposed on a second surface of said printed circuit means.

17. The apparatus of claim 1 wherein said cover means includes:
a perforated indicia bearing overlay; and
a planar protective member disposed between said overlay and said circuit defining element.

18. The apparatus of claim 17 wherein said overlay is removable from said protective member.

19. The apparatus of claim 18 wherein said circuit defining element comprises:
printed circuit means, said circuit means having a first array of through holes of a first diameter arranged in columns and rows, said circuit means further including pairs of contact areas on a first surface about the periphery of at least some of said holes, said contact areas being at least partly arcuate in shape, a first of each of said contact areas for each hole in each row being interconnected by a common conductor disposed on a first surface of said printed circuit means, the second contact areas of each pair being interconnected in columns by means of conductors passing through and principally disposed on a second surface of said printed circuit means.

20. The apparatus of claim 18 further comprising:
a plurality of light sources, said light sources being individually associated with at least some of said circuit defining element apertures, said light sources being positioned so as to be visible through said cover means when energized.

21. The apparatus of claim 19 further comprising:
a plurality of light sources, said light sources being individually associated with at least some of said circuit defining element apertures, said light sources being positioned so as to be visible through said cover means when energized.

22. The apparatus of claim 21 wherein said light sources are light emitting devices having at least two terminals, a first terminal of each of said light emitting devices being connected to a first intercepting conductor associated with an aperture, and wherein said circuit defining element further includes:
further conductors supported on said circuit defining element for establishing a common connection between second terminals of groups of said light emitting devices.

23. The apparatus of claim 1 further comprising:
encoding means for generating a unique binary bit pattern for each unique pair of conductors on said switch matrix circuit defining element, said encoding means being electrically connected to said conductors on said circuit defining element.

24. The apparatus of claim 16 further comprising:
encoding means for generating electrical signals commensurate with a unique binary bit pattern for each unique pair of conductors on said printed circuit means, said encoding means being electrically connected to said interconnecting conductors on said surfaces of said printed circuit means.

25. The apparatus of claim 1 wherein said circuit defining element comprises:
printed circuit means, said circuit means having an array of through holes arranged in columns and rows, said circuit means further including pairs of contact areas on a first surface about the periphery of some of said holes, said contact areas being at least partly arcuate in shape, a first of each of said contact areas for each hole in each row being interconnected by a common row conductors, the second contact areas of each pair being interconnected in columns by means of common column conductors, said column and row conductors being electrically isolated from one another.

26. The apparatus of claim 25 further comprising:
a plurality of light sources, said light sources being individually associated with at least some of said circuit defining element apertures, said light sources being positioned so as to be visible through said cover means when energized.

* * * * *